(12) United States Patent
Zhang et al.

(10) Patent No.: US 10,566,435 B2
(45) Date of Patent: Feb. 18, 2020

(54) GATE STACK QUALITY FOR GATE-ALL-AROUND FIELD-EFFECT TRANSISTORS

(71) Applicant: INTERNATIONAL BUSINESS MACHINES CORPORATION, Armonk, NY (US)

(72) Inventors: Jingyun Zhang, Albany, NY (US); Takashi Ando, Tuckahoe, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/947,411

(22) Filed: Apr. 6, 2018

(65) Prior Publication Data
US 2019/0312120 A1    Oct. 10, 2019

(51) Int. Cl.
*H01L 29/423* (2006.01)
*H01L 29/10* (2006.01)
*H01L 21/8234* (2006.01)

(52) U.S. Cl.
CPC ............ *H01L 29/42392* (2013.01); *H01L 21/823462* (2013.01); *H01L 29/1054* (2013.01)

(58) Field of Classification Search
CPC .................................... H01L 29/42392
USPC ............................................ 257/288
See application file for complete search history.

(56) References Cited

U.S. PATENT DOCUMENTS

| | | | | |
|---|---|---|---|---|
| 7,576,395 B2* | 8/2009 | Jung | ................. | H01L 21/28194 257/351 |
| 8,865,538 B2* | 10/2014 | Clark | .............. | H01L 21/823842 257/369 |
| 9,048,183 B2* | 6/2015 | Ganguli | .................. | C23C 16/06 |
| 9,613,866 B2* | 4/2017 | Ando | .................. | H01L 21/2636 |
| 9,685,371 B2* | 6/2017 | Zope | ................. | H01L 21/76877 |
| 2015/0102287 A1* | 4/2015 | Wang | .................... | H01L 29/775 257/26 |
| 2017/0294523 A1* | 10/2017 | Wu | .................... | H01L 29/66795 |
| 2018/0366545 A1* | 12/2018 | Deng | .................. | H01L 29/1037 |

* cited by examiner

*Primary Examiner* — Jami Valentine Miller
(74) *Attorney, Agent, or Firm* — Tutunjian & Bitetto, P.C.; Vazken Alexanian (57) ABSTRACT

A semiconductor device includes a first gate-all-around field-effect transistor (GAA FET) device including a first gate stack having first channels, interfacial layers formed around the first channels, and dielectric material including first and second portions having respective thicknesses formed on the first interfacial layers. The semiconductor device further includes a second GAA FET device including a second gate stack having second channels, the interfacial layers formed around the second channels, and the dielectric material formed on the second interfacial layers. A threshold voltage (Vt) shift associated with the semiconductor device is achieved based on a thickness of the first portion of the dielectric material.

17 Claims, 11 Drawing Sheets

GATE STACK QUALITY FOR GATE-ALL-AROUND FIELD-EFFECT TRANSISTORS

BACKGROUND

Technical Field

The present invention generally relates to semiconductor devices, and more particularly to gate-all-around field-effect transistors and methods of fabricating thereof.

Description of the Related Art

A gate-all-around (GAA) field effect transistor (FET) is a FET in which the gate is placed on all four sides of a channel of the FET. GAA FETs can reduce problems associated with channel width variations, including but not limited to undesired variability and mobility loss.

SUMMARY

In accordance an embodiment of the present invention, a method for fabricating a semiconductor device is provided. The method includes forming a first metal oxide layer on a first portion of dielectric material formed around channels of a first gate stack of a first gate-all-around field-effect transistor (GAA FET) device and around channels a second gate stack of a second GAA FET device. The first portion of dielectric material is formed during a first deposition process. The method further includes performing an anneal process after forming the first metal oxide layer to achieve a threshold voltage (Vt) shift based on a thickness of the first portion of the dielectric material.

In accordance with another embodiment of the present invention, a method for fabricating a semiconductor device is provided. The method includes forming a first portion of dielectric material on interfacial layers formed around channels of a first gate stack of a first gate-all-around field-effect transistor (GAA FET) device and on interfacial layers formed around channels of a second gate stack of a second GAA FET device. The first portion of the dielectric material is formed during a first deposition process. The method further includes performing a first anneal process after forming the first portion of the dielectric material, forming first and second sacrificial layers within the first and second gate stacks, respectively, forming a first metal oxide layer on each of the first and second sacrificial layers, forming a first protective layer on each of the first metal oxide layers, removing the first protective layers and the first sacrificial layer along with the first metal oxide layer formed on the first sacrificial layer, forming a second metal oxide layer on the first portion of the dielectric material of the first GAA FET device and on the first metal oxide layer of the second GAA FET device, forming second protective layers on the second metal oxide layers, forming layers including amorphous silicon (a-Si) on the second protective layers, performing a second anneal process after forming the layers including a-Si to achieve a threshold voltage (Vt) shift based on a thickness of the first portion of the dielectric material, removing all layers from the first GAA FET device and the second GAA FET device up to the first portion of the dielectric material, and forming a second portion of the dielectric material on the first portion of the dielectric material during a second deposition process to complete the dielectric material formation on the interfacial layers.

In accordance with yet another embodiment of the present invention a semiconductor device is provided. The device includes a first gate-all-around field-effect transistor (GAA FET) device including a first gate stack having first channels, interfacial layers formed around the first channels, and dielectric material including first and second portions having respective thicknesses formed on the first interfacial layers. The device further includes a second GAA FET device including a second gate stack having second channels, the interfacial layers formed around the second channels, and the dielectric material aimed on the second interfacial layers. A threshold voltage (Vt) shift associated with the semiconductor device is achieved based on a thickness of the first portion of the dielectric material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Due to limited spacing between gate stack channels, conventional gate stack channels do not have a run-path to simultaneously achieve reliability anneal and multi-threshold voltage (Vt). The reliability anneal process can include depositing a capping layer, performing a spike anneal, and then removing the capping layer. Such gate stack channels can be in the form of nanosheets composed of one or more semiconductor materials. For example, the nanosheets can be composed of silicon (Si).

The embodiments described herein provide for the formation of dielectric material on interfacial layers (ILs) formed on gate stack channels of GAA FET devices in separate dielectric material deposition processes, as opposed to a single dielectric material deposition process. For example, the dielectric layer formed during a first dielectric material deposition process will have a thickness less than a total thickness for the dielectric material, and the dielectric layer formed on the first dielectric layer during a second dielectric material deposition process will have a thickness such that the combined thickness of the dielectric layers is equal to about the total thickness. In one embodiment, the total thickness can be from about 1 nm to about 3 nm, the dielectric layer formed during the first dielectric material deposition process can have a thickness of about 0.5 nm to about 2 nm, and the dielectric layer formed during the second dielectric material deposition process can have a thickness of about 0.5 nm to about 1 nm. In an illustrative example, if the total thickness is about, e.g., 1.7 nm, the dielectric layer formed during the first dielectric material deposition process can have a thickness of about 1 nm, and the dielectric layer formed during the second dielectric material deposition process can have a thickness of about 0.7 nm. However, such thicknesses should not be considered limiting.

By separating the formation of the dielectric material into separate dielectric material deposition processes, reliability annealing and multi Vt processing of GAA FETs at low thermal budget can be achieved. The reduced thermal budget can prevent IL regrowth for the GAA FET devices. A first one of the GAA FET devices can be a device with dipole engineering to modulate Vt, and a second one of the GAA FET devices can be a device without dipole engineering, which will have a different Vt from the first GAA FET device.

To simultaneously achieve the reliability annealing and multi-Vt, the embodiments described herein can use a modified high-k dielectric profile along with a laser anneal, although any dielectric and anneal process can be employed in accordance with the embodiments described herein. The improved gate stack quality for GAA FETs realized by the embodiments described herein can provide further benefits regarding negative-bias temperature instability (NBTI) and inversion-layer thickness ($T_{inv}$) of the gate stack.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIGS. 1-11 depict respective steps of a process flow for fabricating semiconductor devices to improve gate-stack quality for GAA FETs.

Figure 1:
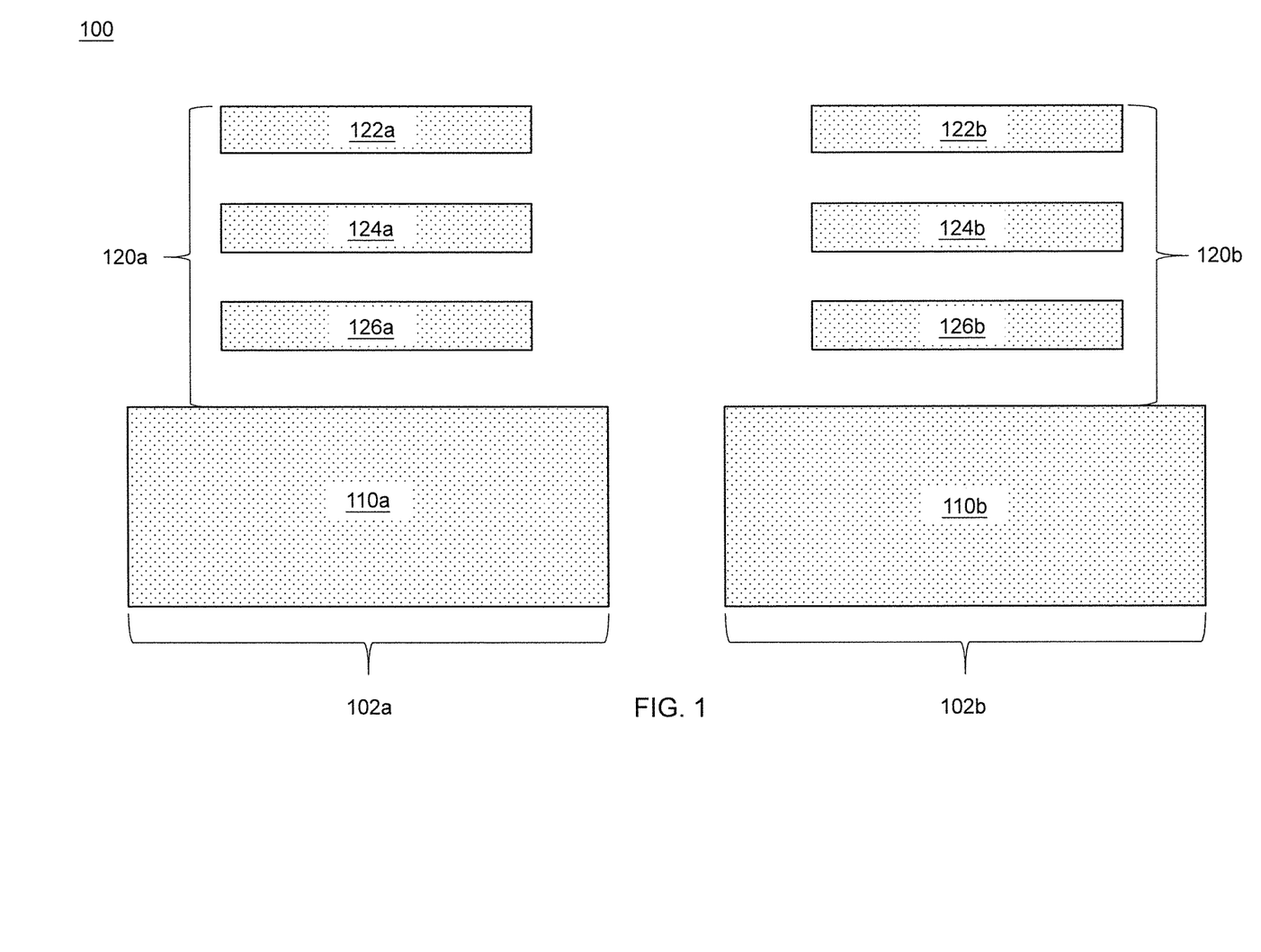
FIG. 1 is a cross-sectional view of post channel release of channels of gate stacks of devices during the fabrication of a semiconductor device, in accordance with an embodiment of the present invention.

Referring to FIG. 1, a cross-sectional view showing an exemplary semiconductor device 100 during post channel release is provided. As shown, the device 100 includes a GAA FET device 102a and a GAA FET device 102b. In one embodiment, the GAA FET device 102a is a device with dipole engineering to modulate Vt, and the GAA FET device 102b is a device without dipole engineering, which will have a different Vt from the first GAA FET device.

The GAA FET device 102a includes a substrate 110a and the GAA FET device 102b includes a substrate 110b. In one embodiment, the substrates 110a and 110b include Si, although the materials of the substrates 110a and 110b should not be considered limiting. The substrates 110a and 110b can include any suitable substrate structure, e.g., a bulk semiconductor, a semiconductor-on-insulator (SOI) substrate, etc. In one example, at least one of the substrates 110a and 110b can include a silicon-containing material. Illustrative examples of Si-containing materials suitable for the substrate can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The GAA FET device 102a includes a gate stack 120a that includes a plurality of channels, including channels 122a, 124a and 126a. The GAA FET device 102b includes a gate stack 120b that includes a plurality of channels, including channels 122b, 124b and 126b.

As shown, the channels 122a-126a and the channels 122b-126b have surrounding material removed, but are supported at locations not depicted in the cross-sectional view.

In one embodiment, each of the channels 122a-126a and 122b-126b is formed from a nanosheet. One or more of the nanosheets can include Si. However, any material suitable for use as a channel material can be used in accordance with the embodiments described herein. Illustratively, the thickness of each channel can be between about 4 nm to about 8 nm, and the spacing between each channel, also referred to herein as inter-channel spacing, can be between about 8 nm to about 13 nm. More specifically, the thickness of each channel can be about 6 nm, and the spacing between each channel, also referred to herein as inter-channel spacing, can be about 11 nm.

Figure 2:
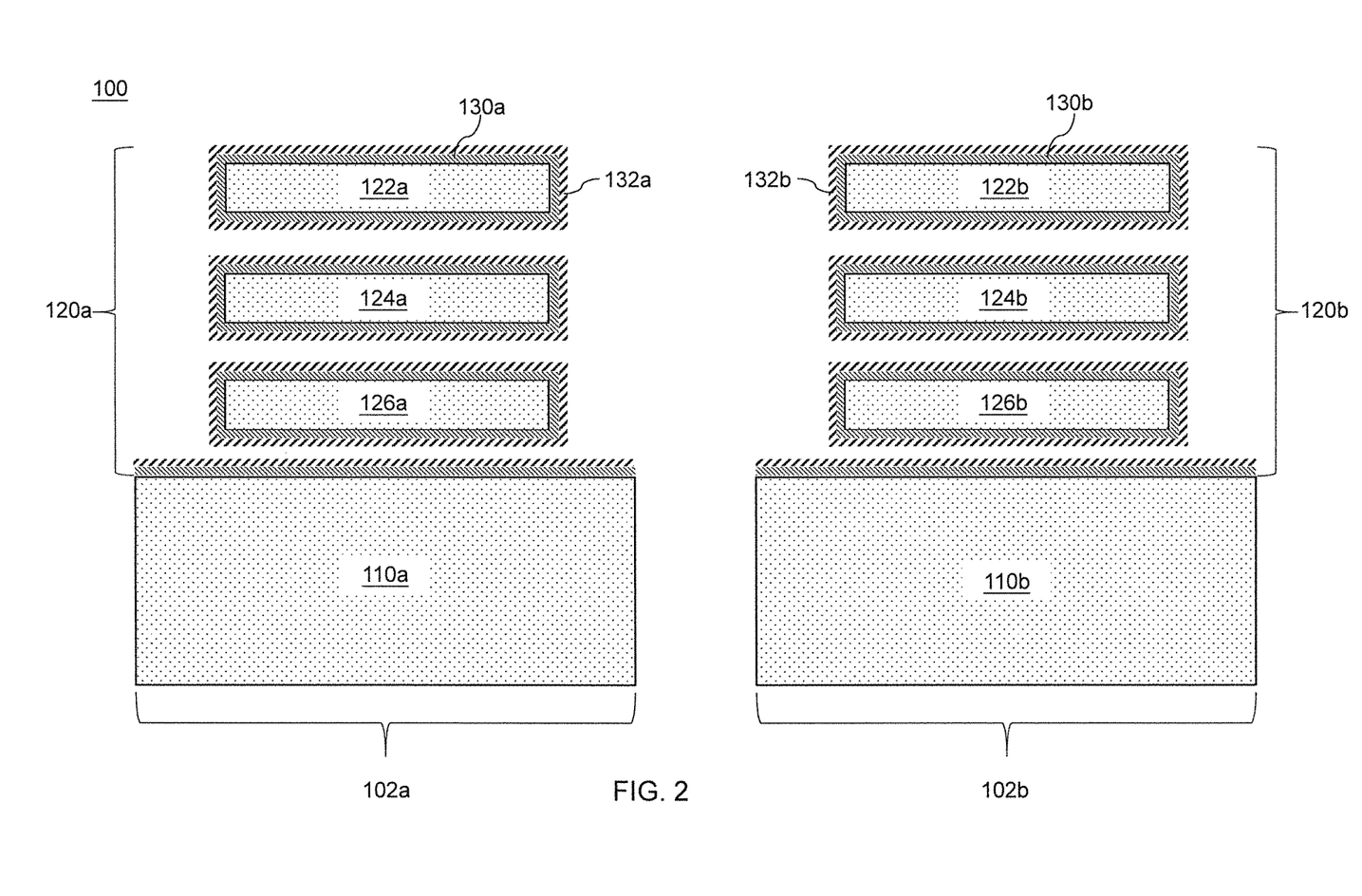
FIG. 2 is a cross-sectional view of layers formed on the channels during the fabrication of the semiconductor device, in accordance with an embodiment of the present invention.

Referring to FIG. 2, an interfacial layer (IL) 130a is formed around each of the channels 122a-126a and on the surface of the substrate 110a, dielectric material 132a is formed on the IL 130a, an IL 130b is formed around each of the channels 122a-126b and on the surface of the substrate 110b, and dielectric material 132b is formed on the ILs 130b. ILs 130a and 130b and dielectric materials 132a and 132b can be formed employing any deposition process and/or etching process suitable for use in accordance with the embodiments described herein (e.g., atomic layer deposition (ALD)).

The ILs 130a and 130b can include any material suitable for use as an IL. Such materials may include, but are not limited to, silicon dioxide ($SiO_2$), hafnium silicates, and silicon oxynitrides. The dielectric materials 132a and 132b can include high-k dielectric material, although any type of dielectric material can be used in accordance with the embodiments described herein. A high-k dielectric material is a dielectric material having a dielectric constant (k) higher than the dielectric constant of silicon dioxide ($SiO_2$) at room temperature (20° C.-25° C.) and atmospheric pressure (1 atm). Such high-k dielectric materials may include, but are not limited to, hafnium oxides, hafnium silicates, titanium oxides, barium-strontium-titantates (BSTs) and lead-zirconate-titanates (PZTs).

As previously mentioned, instead of forming all the dielectric material on the ILs 130a and 130b in a single dielectric material deposition process, the embodiments described herein separate the formation of the dielectric material on the ILs 130a and 130b into two separate dielectric material deposition processes. Thus, the dielectric materials 132a and 132b correspond to a first portion of the dielectric material formed on the ILs 130a and 130b during a first dielectric material deposition process.

In one embodiment, the dielectric material formed around the ILs 130a and 130b can have a total thickness (e.g., a total thickness of the first portion of the dielectric material and a second portion of the dielectric material) of between about 1 nm to about 3 nm. More specifically, in one embodiment, the total thickness is about 1.7 nm.

The thickness of the dielectric material formed during the first deposition process, dielectric materials 132a and 132b, is less than the total thickness. In one embodiment, the thickness of the ILs 130a and 130b can be between about 0.5 nm to about 1.5 nm, the thickness of the dielectric materials 132a and 132b can be between about 0.5 nm to about 2 nm, and the inter-channel spacing is reduced by about 1 nm to about 3.5 nm. For example, in the embodiment in which the total thickness is about 1.7 nm, the thickness of each of the ILs 130a and 130b can be about 0.7 nm, the thickness of the dielectric materials 132a and 132b can be about 1 nm, and the inter-channel spacing is reduced by about 3.4 nm.

The thickness of the dielectric material formed during the first deposition process, dielectric materials 132a and 132b, can be chosen to provide advantages over conventional GAA FET fabrication processes. For example, the thickness of the dielectric materials 132a and 132b should be sufficiently small to reduce or prevent crystallization during an annealing process performed after the dielectric materials 132a and 132b are formed on the ILs 130a and 130b. Performing the annealing process on the dielectric materials 132a and 132b having a sufficiently small thickness and without a capping layer can improve bias temperature instability (BTI). For example, in one embodiment, the annealing process is a laser annealing process, such as laser spike annealing (LSA). The LSA can be performed at about 1200 degrees Celsius, and can be performed without a capping layer. However, any suitable anneal process can be performed in accordance with the embodiments described herein.

Figure 3:
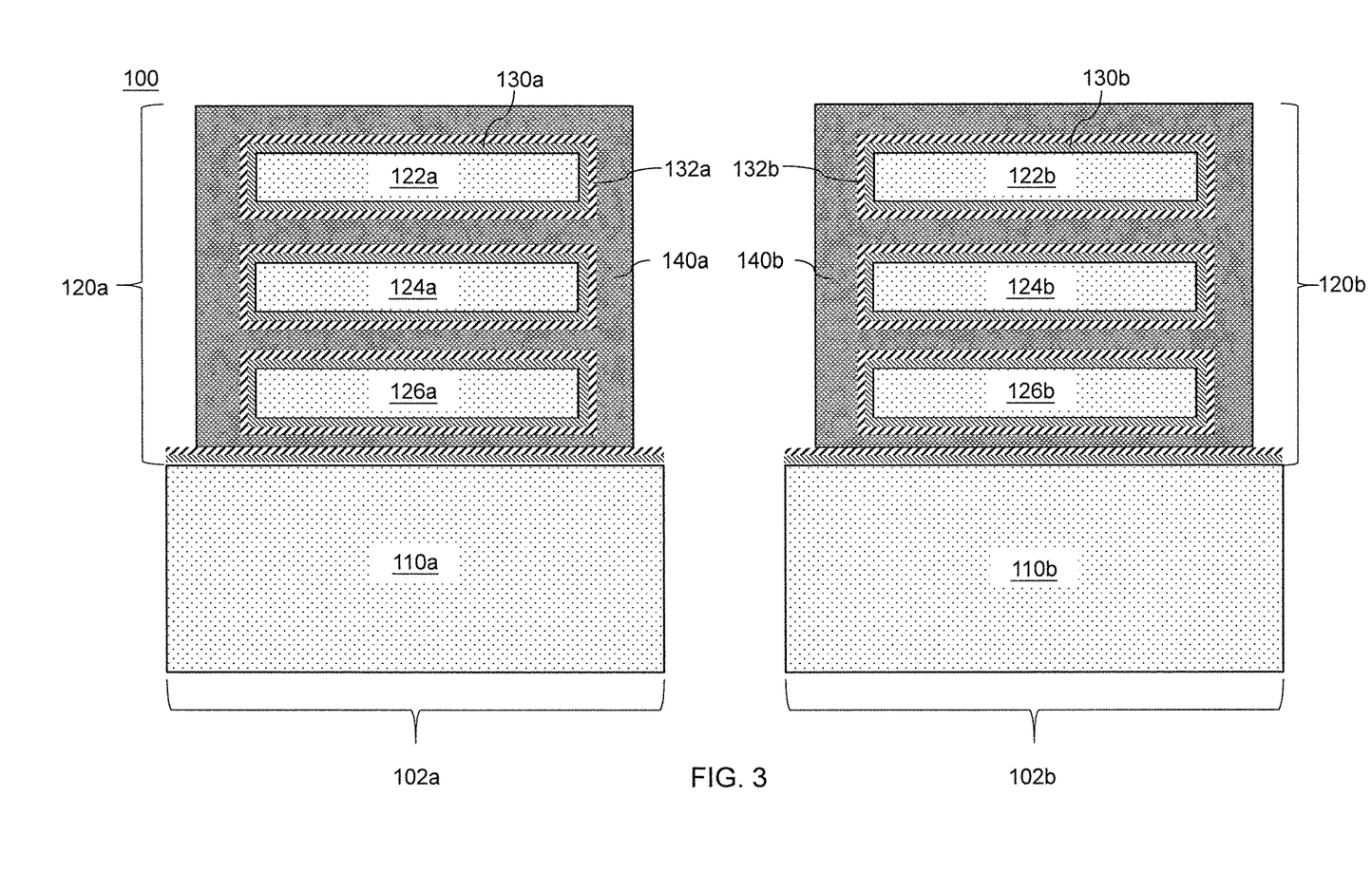
FIG. 3 is a cross-sectional view of diffusion barriers formed within gaps in the gate stacks during the fabrication of the semiconductor device, in accordance with an embodiment of the present invention.

Referring to FIG. 3, a sacrificial layer 140a is formed surrounding the gate stack 120a and a sacrificial layer 140b is formed surrounding the gate stack 120b. In one embodiment, the sacrificial layers 140a and 140b include titanium nitride (TiN), although any suitable material can be used in accordance with the embodiment described herein. Other examples of materials that the sacrificial layers 140a and 140b can include are TaN, TiAlC, etc. The sacrificial layers 140a and 140b can be formed using any suitable process in accordance with the embodiments described herein. The sacrificial layers 140a and 140b should have a thickness to pinch-off the gap. In one embodiment, the sacrificial layers 140a and 140b can each have a thickness between about 4 nm to about 6 nm. More specifically, in the case that the formation of the ILs 130a and 130b and the dielectric material 132a and 132b reduces the inter-channel spacing by about 3.4 nm, the sacrificial layers 140a and 140b can each have a thickness of about 4 nm.

Figure 4:
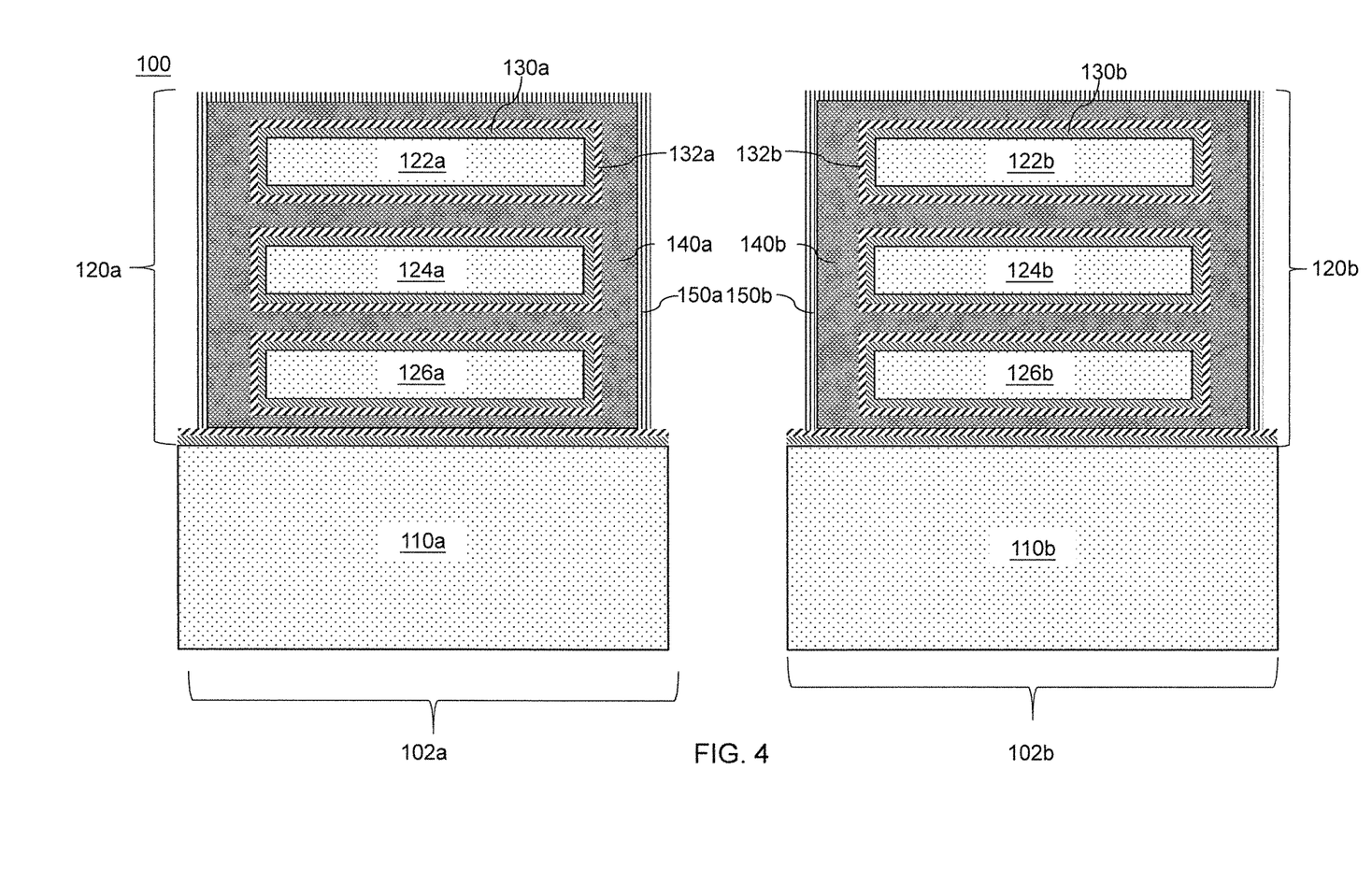
FIG. 4 is a cross-sectional view of layers formed on the diffusion barriers during the fabrication of the semiconductor device, in accordance with an embodiment of the present invention.

Referring to FIG. 4, a metal oxide layer 150a is formed on the sacrificial layer 140a and a metal oxide layer 150b is formed on the sacrificial layer 140b. In one embodiment, the metal oxide layers 150a and 150b include transition metal oxides. Transition metal oxides are compounds that include oxygen atoms bound to transition metals. Non-limiting examples of metal oxides that metal oxide layers 150a and 150b can include are $La_2O_3$, $Y_2O_3$, $Al_2O_3$, $Lu_2O_3$, $MgO_2$, etc. The metal oxide layers 150a and 150b can be formed using any suitable process in accordance with the embodiments described herein. In one embodiment, the dielectric layers 150a and 150b can each have a thickness of between about 0.5 nm to about 2 nm.

Figure 5:
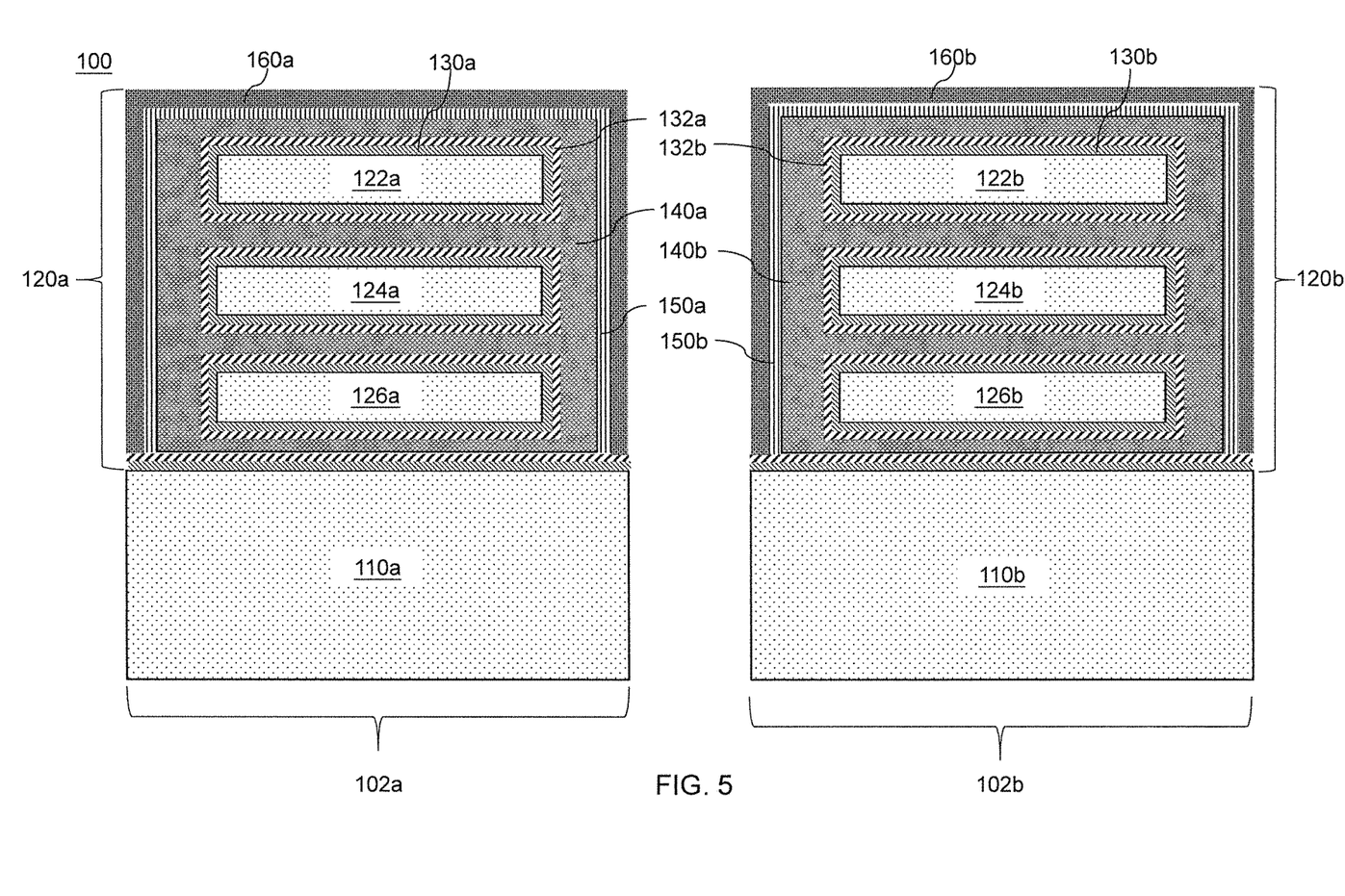
FIG. 5 is a cross-sectional view of additional layers formed on the layers formed on the diffusion barriers during the fabrication of the semiconductor device, in accordance with an embodiment of the present invention.

Referring to FIG. 5, a protective layer 160a is formed on the metal oxide layer 150a and a protective layer 160b is formed on the metal oxide layer 150b. The protective layers 160a and 160b function to protect and provide connectivity to the metal oxide layers 150a and 150b, respectively. In one embodiment, the protective layers 160a and 160b include metal organic TiN (Mo—TiN). However, the protective layers 160a and 160b can include any suitable material in accordance with the embodiments described herein. For example, the protective layers 160a and 160b can include Mo—TaN, Mo—TiAlC, etc. Each of the protective layers 160a and 160b can have a thickness from about 1 nm to about 2 nm. More specifically, in one embodiment, each of the protective layers 160a and 160b can have a thickness of about 1.5 nm.

Figure 6:
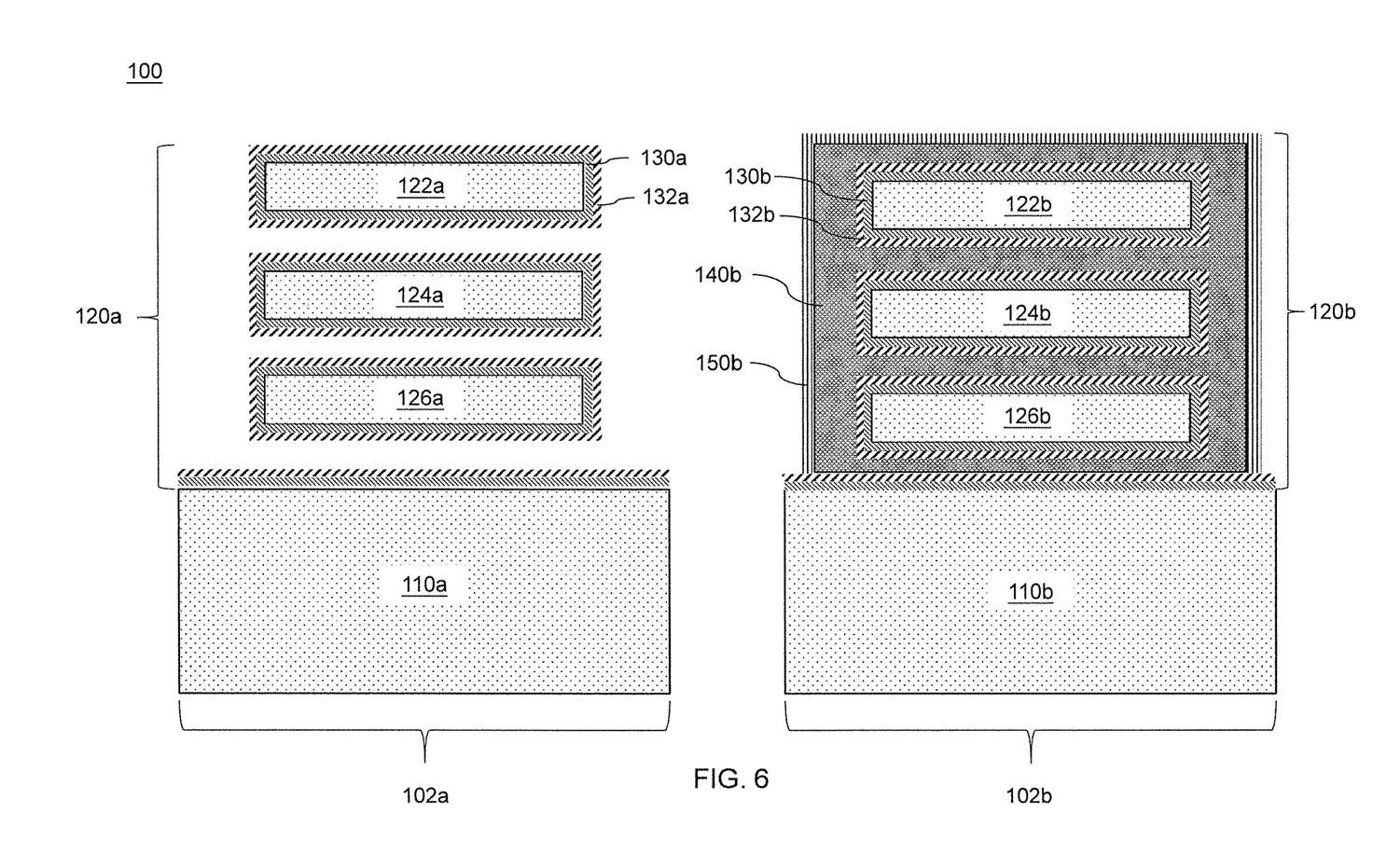
FIG. 6 is a cross-sectional view of material removed during the fabrication of the semiconductor device, in accordance with an embodiment of the present invention.

Referring to FIG. 6, an etch process is performed to remove the layers 140a-160a from the GAA FET device 102a, and the protective layer 160b from the GAA FET device 102b. The dielectric layer 150b functions as a hard mask to stop the etch process with respect to the GAA FET device 102b.

Figure 7:
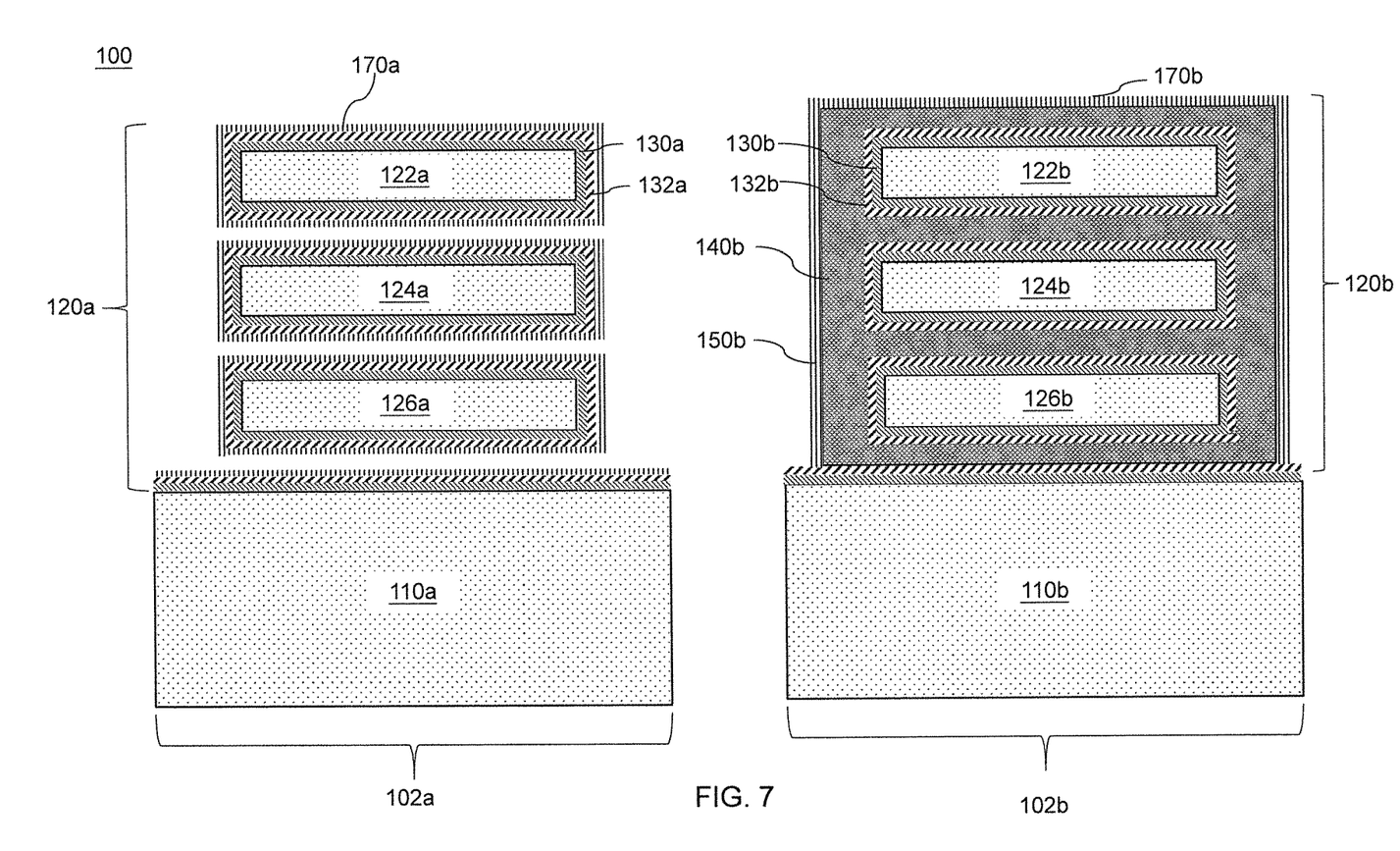
FIG. 7 is a cross-sectional view of layers formed in a given number of deposition cycles after the removal of the material during the fabrication of the semiconductor device, in accordance with an embodiment of the present invention.

Referring to FIG. 7, a metal oxide layer 170a is formed around the dielectric material 132a and a metal oxide layer 170b is formed on the dielectric layer 150b. The metal oxide layers 170a and 170b can be formed in a given number of deposition cycles to achieve thicknesses corresponding to a given Vt shift and low drive-in temperature, based on the thickness of the dielectric material in the layer 130a. For example, if the thickness of the dielectric material 132a is about 1 nm, the metal oxide layers 170a and 170b can be formed in about five cycles to achieve a Vt shift of about 150 mV. In one embodiment, the metal oxide layers 170a and 170b include transition metal oxides, such as those described above with reference to FIG. 4.

The metal oxide layers 170a and 170b can each have a thickness of about 0.3 nm to about 1 nm, thereby reducing the inter-channel spacing by about 0.6 nm to about 2 nm.

Figure 8:
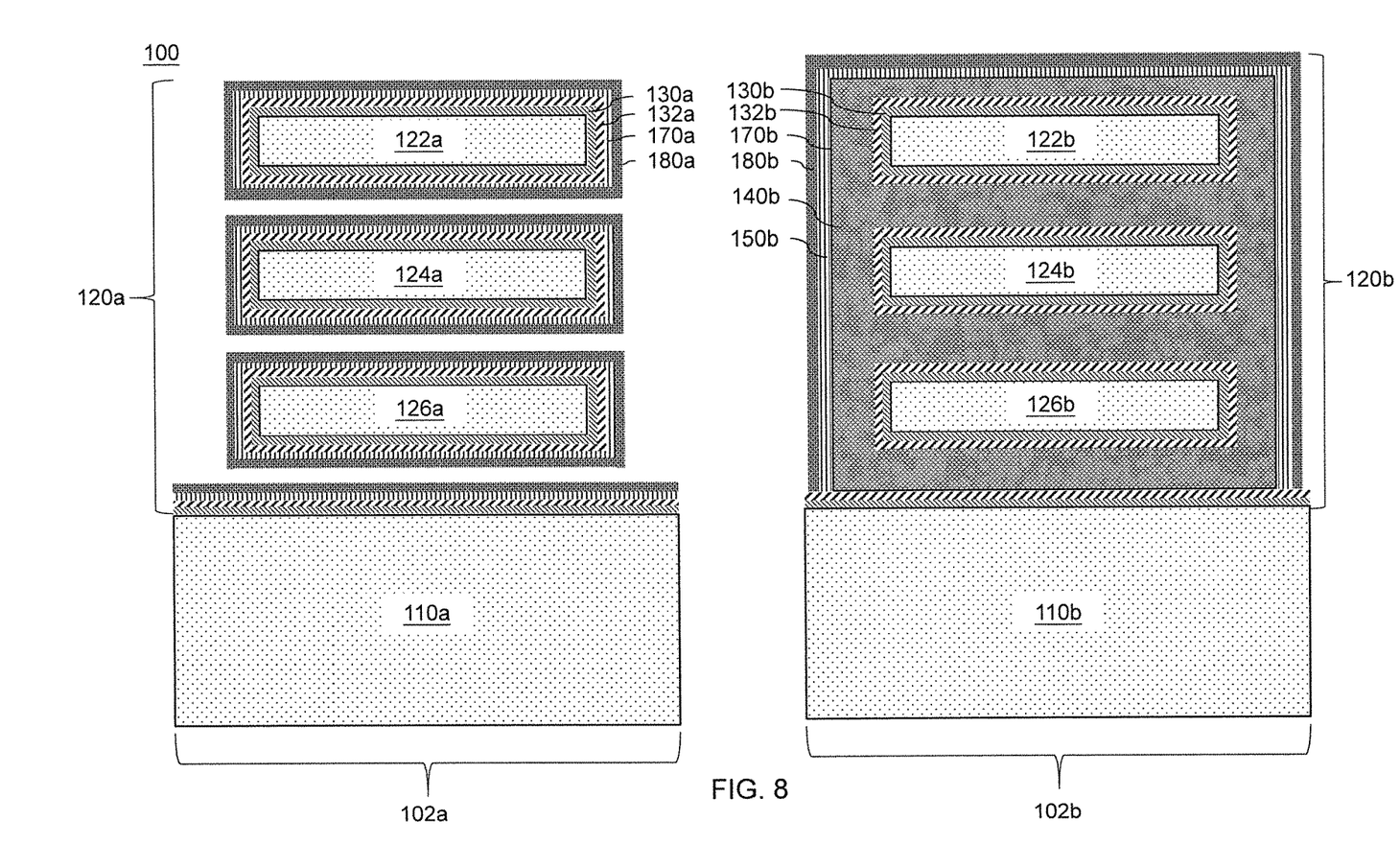
FIG. 8 is a cross-sectional view of additional layers formed on the layers formed in the given number of deposition cycles, in accordance with an embodiment of the present invention.

Referring to FIG. 8, a protective layer 180a is formed on the dielectric layer 170a and a protective layer 180b is formed on the metal oxide layer 170b. In one embodiment, the protective layers 180a and 180b include Mo—TiN. However, the protective layers 180a and 180b can include any suitable material in accordance with the embodiments described herein. For example, the protective layers 180a and 180b can include Mo—TaN, Mo—TiAlC, etc.

At least the protective layer 180a can have a thickness between about 1 nm to about 2 nm 1.5 nm. More specifically, at least the protective layer 180a can have a thickness of about 1.5 nm, thereby reducing the inter-channel spacing by about 3 nm.

Figure 9:
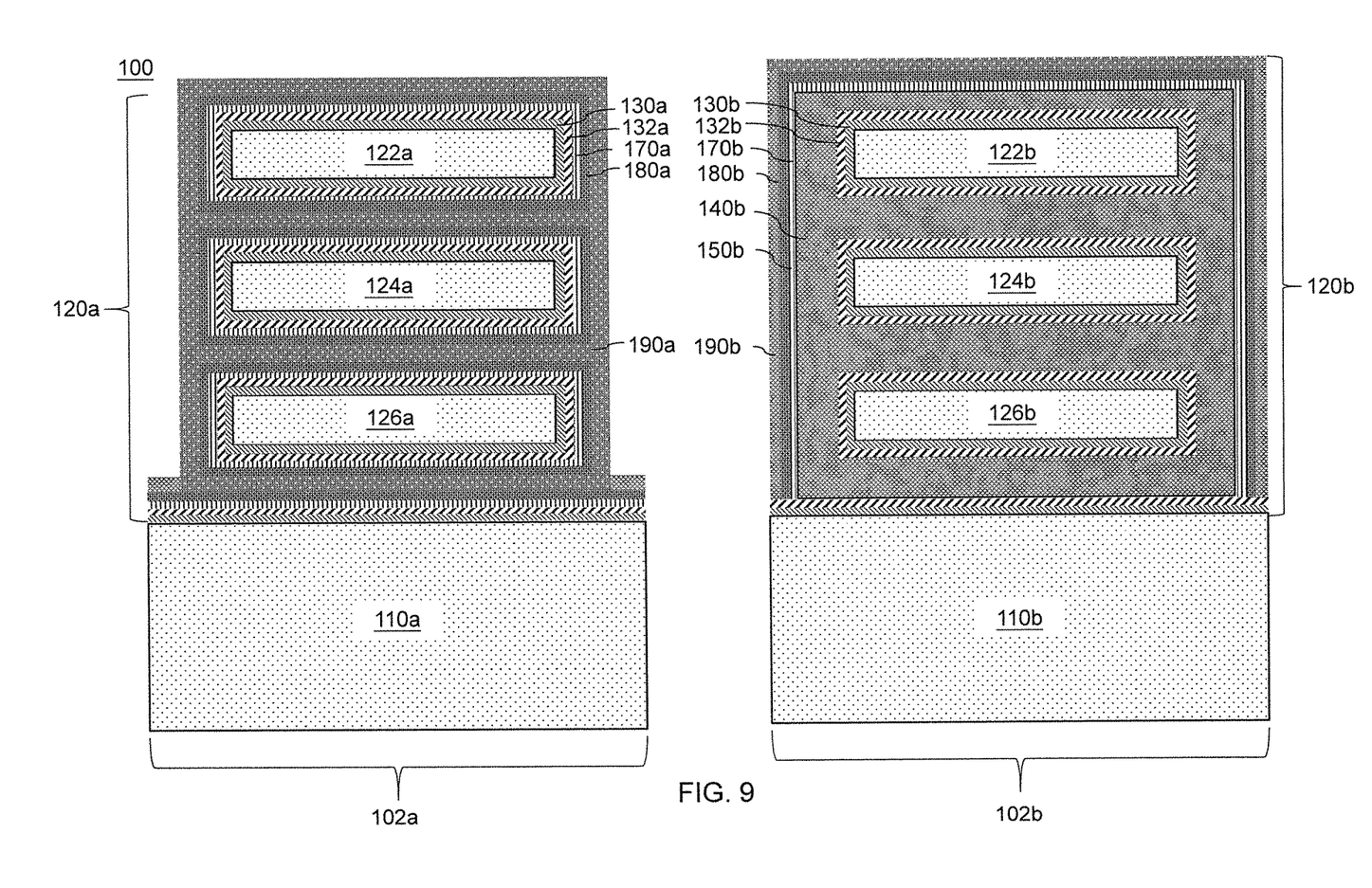
FIG. 9 is a cross-sectional view of material formed within gaps in the gate stacks during the fabrication of the semiconductor device, in accordance with an embodiment of the present invention.

Referring to FIG. 9, a layer 190a is formed on the protective layer 180a and a layer 190b is formed on the protective layer 180b. In one embodiment, the layers 190a and 190b include a Si material (e.g., amorphous Si). The layer 190a has a thickness that pinches off the gaps between the channels 122a-126a.

An anneal process can then be performed after forming the layers 190a and 190b. As described above, the thickness of the dielectric material 132a and 132b is less than that of the total thickness. This allows the anneal process to be performed at a temperature lower than about 970 degrees Celsius, which is the anneal temperature used in conventional implementations. For example, in one embodiment, the anneal process can be performed at a temperature of about 875 degrees Celsius. Any suitable anneal process (e.g., LSA) can be performed in accordance with the embodiments described herein.

Figure 10:
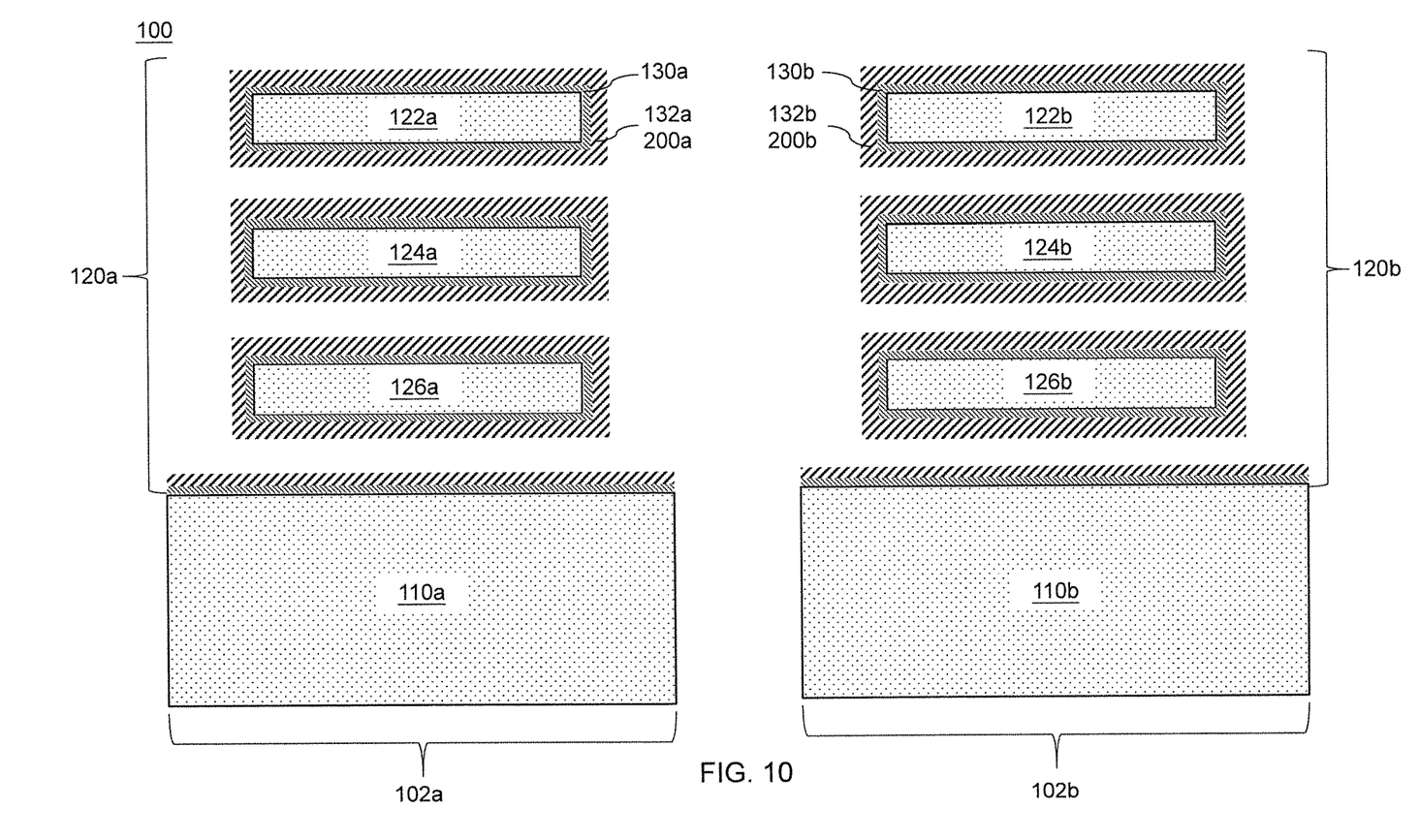
FIG. 10 is a cross-sectional view of dielectric material formed during the fabrication of the semiconductor device, in accordance with an embodiment of the present invention.

Referring to FIG. 10, layers 170a-190a are removed from the GAA FET device 102a, layers 140b, 150b and 170b-190b are removed from the GAA FET device 102b, and dielectric materials 200a and 200b are formed on the dielectric materials 132a and 132b, respectively. The dielectric materials 200a and 200b correspond to a second portion of dielectric material formed on the dielectric materials 132a and 132b during the second deposition process to complete the formation of the dielectric material on the ILs 130a and 130b. The dielectric materials 200a and 200b can include the same dielectric material used to form the dielectric materials 132a and 132b (e.g., a high-k dielectric material). Thus, in the embodiment in which the combined thickness of the dielectric material formed on the ILs 130a and 130b is between about 0.5 nm to about 1.5 nm and the dielectric materials 132a and 132b each have a thickness between about 0.5 nm to about 2 nm, the dielectric materials 200a and 200b can each have a thickness between about 0.5 nm to about 1 nm. More specifically, in the embodiment in which the combined thickness is about 1.7 nm and the dielectric materials 132a and 132b each have a thickness of about 1 nm, the dielectric materials 200a and 200b can each have a thickness of about 0.7 nm.

Figure 11:
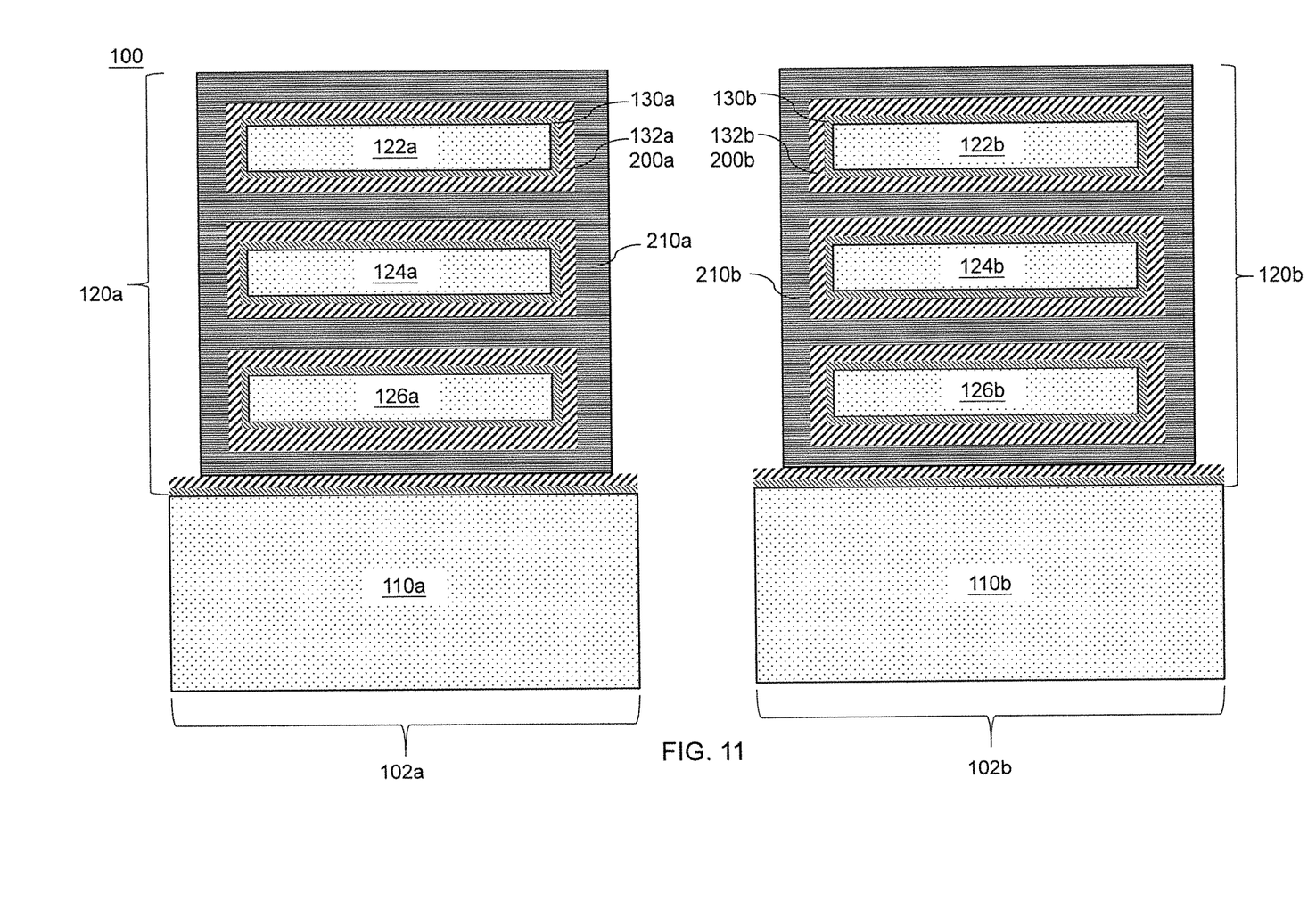
FIG. 11 is a cross-sectional view of a work function metal formed within gaps in the gate stacks during the fabrication of the semiconductor device, in accordance with an embodiment of the present invention.

Referring to FIG. 11, a work function metal 210a is formed on the dielectric material 200a and a work function metal 210b is formed on the dielectric material 200b. The work function metal can include any suitable metal and can be formed from using any suitable technique in accordance with the embodiments described herein.

Having described preferred embodiments of a semiconductor device and a method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating a semiconductor device, comprising:
    forming a first metal oxide layer on a first portion of dielectric material, the first portion of dielectric material being formed around first channels of a first gate stack of a first gate-all-around field-effect transistor (GAA FET) device and around second channels of a second gate stack of a second GAA FET device during a first deposition process; and
    performing an anneal process after forming the first metal oxide layer to achieve a threshold voltage (Vt) shift based on a thickness of the first portion of the dielectric material.

2. The method of claim 1, wherein the anneal process is performed below about 970 degrees Celsius.

3. The method of claim 1, further comprising forming the first portion of dielectric material on interfacial layers, the interfacial layers being formed around the first and second channels during the first deposition process.

4. The method of claim 3, further comprising performing a second anneal process after forming the first portion of the dielectric material.

5. The method of claim 4, further comprising forming first and second sacrificial layers within the first and second gate stacks, respectively.

6. The method of claim 5, further comprising forming a second metal oxide layer on each of the first and second sacrificial layers.

7. The method of claim 6, further comprising forming a first protective layer on each of the first metal oxide layers, and removing the first protective layers and the first sacrificial layer along with the first metal oxide layer formed on the first sacrificial layer.

8. The method of claim 7, further comprising, after forming the first metal oxide layer:
    forming second protective layers on the second metal oxide layers; and
    forming layers including amorphous silicon (a-Si) on the second protective layers.

9. The method of claim 1, further comprising, after performing the anneal process:
    removing all layers from the first GAA FET device and the second GAA FET device up to the first portion of the dielectric material; and
    forming a second portion of the dielectric material on the first portion of the dielectric material during a second deposition process to complete the dielectric material formation on the interfacial layers.

10. The method of claim 9, wherein the first and second portions of the dielectric material have a combined thickness between about 1 nm to about 3 nm.

11. The method of claim 10, wherein the first portion of the dielectric material has a thickness between about 0.5 nm to about 2 nm and the second portion of the dielectric material has a thickness between about 0.5 nm and 1 nm.

12. The method of claim 9, further comprising forming a work function metal within the first and second gate stacks after forming the second portion of the dielectric material.

13. A method for fabricating a semiconductor device, comprising:
    forming a first portion of a dielectric material on interfacial layers during a first deposition process, the interfacial layers being formed around first channels of a first gate stack of a first gate-all-around field-effect transistor (GAA FET) device and around second channels of a second gate stack of a second GAA FET device;
    performing a first anneal process after forming the first portion of the dielectric material;
    forming first and second sacrificial layers within the first and second gate stacks, respectively;
    forming a first metal oxide layer on each of the first and second sacrificial layers;
    forming a first protective layer on each of the first metal oxide layers;
    removing the first protective layers and first sacrificial layer along with the first metal oxide layer formed on the first sacrificial layer;
    forming a second metal oxide layer on the first portion of the dielectric material of the first GAA FET device and on the first metal oxide layer of the second GAA FET device;
    forming second protective layers on the second metal oxide layers;
    forming layers including amorphous silicon (a-Si) on the second protective layers;
    performing a second anneal process after forming the layers including a-Si to achieve a threshold voltage (Vt) shift based on a thickness of the first portion of the dielectric material;

removing all layers from the first GAA FET device and the second GAA FET device up to the first portion of the dielectric material; and forming a second portion of the dielectric material on the first portion of the dielectric material during a second deposition process to complete the dielectric material formation on the interfacial layers.

14. The method of claim 13, wherein the second anneal process is performed below about 970 degrees Celsius.

15. The method of claim 13, wherein the first and second portions of the dielectric material have a combined thickness between about 1 nm to about 3 nm.

16. The method of claim 15, wherein the first portion of the dielectric material has a thickness between about 0.5 nm to about 2 nm and the second portion of the dielectric material has a thickness between about 0.5 nm to about 1 mm.

17. The method of claim 13, farther comprising forming a work function metal within the first and second gate stacks after forming the second portion of the dielectric material.

* * * * *